(12) United States Patent
Aebersold

(10) Patent No.: US 9,030,328 B2
(45) Date of Patent: May 12, 2015

(54) INTEGRATED CIRCUIT TO OPERATE IN AN AREA OF IONIZING RADIATION, AND HAVING AN OUTPUT FOR A RADIATION DOSE-DEPENDENT WAY DAMAGE INFORMATION, AND ALARM INDICATORS AND CORRESPONDING METHOD

(71) Applicant: Siemens Aktiengesellschaft, Munich (DE)

(72) Inventor: Hans Aebersold, Bonstetten (CH)

(73) Assignee: Siemens Aktiengsellschaft, Munich (DE)

( * ) Notice: Subject to any disclaimer, the term of this patent is extended or adjusted under 35 U.S.C. 154(b) by 550 days.

(21) Appl. No.: 13/655,029

(22) Filed: Oct. 18, 2012

(65) Prior Publication Data
US 2014/0097958 A1   Apr. 10, 2014

(30) Foreign Application Priority Data

Oct. 10, 2012 (DE) .......................... 10 2012 218 486

(51) Int. Cl.
| | |
|---|---|
| *G08B 17/10* | (2006.01) |
| *G08B 17/103* | (2006.01) |
| *G08B 29/00* | (2006.01) |
| *H01L 23/34* | (2006.01) |

(52) U.S. Cl.
CPC .............. *G08B 17/103* (2013.01); *G08B 29/00* (2013.01); *H01L 2924/0002* (2013.01); *H01L 23/345* (2013.01)

(58) Field of Classification Search
USPC ................... 340/584, 627–634, 693.1, 693.4; 73/31.05–31.07; 702/58
See application file for complete search history.

(56) References Cited

U.S. PATENT DOCUMENTS

| | | | |
|---|---|---|---|
| 6,815,643 B2 | 11/2004 | Der Ropp | |
| 8,093,535 B2 | 1/2012 | Heismann et al. | |
| 2003/0142724 A1 | 7/2003 | Barth et al. | |
| 2013/0120150 A1 | 5/2013 | Aebersold et al. | |

FOREIGN PATENT DOCUMENTS

| | | |
|---|---|---|
| DE | 10034262 C1 | 9/2001 |
| DE | 102005061358 A1 | 7/2007 |
| EP | 2595126 A1 | 5/2013 |
| WO | 02/11147 A2 | 2/2002 |

OTHER PUBLICATIONS

PCT International Search Report mailed Feb. 28, 2014 in corresponding International Application No. PCT/EP2013/071035.

*Primary Examiner* — George Bugg
*Assistant Examiner* — Sharmin Akhter
(74) *Attorney, Agent, or Firm* — Staas & Halsey LLP

(57) ABSTRACT

An integrated circuit, in particular a microcontroller, for operation in an area with ionizing radiation, has at least one part of a temperature control circuit. The temperature control circuit performs a regulated increase in the circuit temperature to a predefined, essentially constant operating temperature, by increasing the electrical power consumption of the circuit by an adjustable additional electrical power. The circuit has an output facility for information about damage to the integrated circuit caused by the ionizing radiation impacting thereon, it being possible to determine the information about damage from a radiation-dose-dependent decrease in the adjustable additional electrical power.

17 Claims, 4 Drawing Sheets

INTEGRATED CIRCUIT TO OPERATE IN AN AREA OF IONIZING RADIATION, AND HAVING AN OUTPUT FOR A RADIATION DOSE-DEPENDENT WAY DAMAGE INFORMATION, AND ALARM INDICATORS AND CORRESPONDING METHOD

CROSS REFERENCE TO RELATED APPLICATIONS

This application is based on and hereby claims priority to German Application No. 10 2012 218 486.4 filed on Oct. 10, 2012, the contents of which are hereby incorporated by reference.

BACKGROUND

The invention relates to an integrated circuit, for operation in an area with ionizing radiation.

The invention further relates to a hazard alarm for operation in an area with ionizing radiation.

Finally the invention relates to a method for determining information about damage to an integrated circuit caused by ionizing radiation impacting thereon.

An integrated circuit (also called IC for short) is an electronic circuit accommodated on a semiconductor substrate or on a semiconductor chip. It is consequently also called a solid-state circuit or a monolithic circuit.

An integrated circuit of this type typically has a plurality of electronic components wired to one another. The semiconductor material from which the integrated circuit is manufactured is preferably silicon. Alternatively it can be a germanium, gallium arsenide, silicon carbide or other suitable semiconductor material. Preferably a CMOS (Complementary Metal Oxide Semiconductor) semiconductor process is used for the technical implementation of the semiconductor components of the integrated circuit. Alternatively use can also be made of a PMOS or NMOS semiconductor process, a bipolar semiconductor process or a combination thereof, e.g. a BiCMOS semiconductor process.

The hazard alarms are e.g. fire alarms, e.g. optical smoke detectors or heat detectors. Optical smoke detectors can be based e.g. on the scattered light principle or on the optoacoustic principle. If the hazard alarm is a heat detector, the temperature currently prevailing in the vicinity of the heat detector is detected, e.g. by a temperature-dependent resistor. The hazard alarms in question can also be smoke gas detectors, which have a gas sensor as a detector unit, e.g. a gas FET (Field Effect Transistor). Furthermore, the hazard alarms can be motion detectors which have a PIR (Passive Infrared) detector unit for motion detection. The hazard alarms in question can also comprise combinations of the aforementioned detector units.

The hazard alarm can also be designed as a linear smoke detector which is based on the extinction principle. Such linear smoke detectors are in particular used in large or narrow spaces, for example in corridors, warehouses and fabrication halls and in aircraft hangars, and are mounted underneath the ceiling on the walls. In a first embodiment transmitter and receiver are opposite one another, and no reflector is necessary. In a second embodiment the light beam emitted by the transmitter is deflected via a reflector back to a receiver. Transmitter and receiver are disposed adjacent to one another. The measured distance of such linear smoke detectors is typically in the range between 20 m and 200 m, which in the case of the first embodiment corresponds to a distance between transmitter and receiver corresponding to the measured distance. In the second embodiment the distance between transmitter/receiver and the reflector corresponds to half the measured distance.

Ionizing radiation means particle radiation or electromagnetic radiation with ionizing energies of 5 eV and more which is able to eject electrons from atoms or molecules so that positively charged ions or molecular residues are left behind.

Much ionizing radiation arises from radioactive substances, e.g. in an area with increased, in particular with high radioactive radiation. Such areas can be e.g. a nuclear area or outer space. Nuclear areas in particular refer to spatially delimited areas for example inside a nuclear power plant, a nuclear recycling facility or a final or intermediate place of storage for radioactive waste.

Ionizing or radioactive radiation generally has a destructive damaging effect on electronic components and in particular on semiconductor components. Such components have very fine semiconductor structures of less than 1 μm, in particular of less than 100 nm. All types of high-energy ionizing radiation interact in this case with a semiconductor crystal. While it is possible to shield against alpha and beta radiation, as particle radiation, using materials just a few millimeters thick, e.g. a housing plate or a plastic housing, effective shielding against electromagnetic gamma radiation is possible only by the use of large amounts of material. Depending on the shielding required, lead shields with a shielding thickness of a meter and more may be required. Even though shielding against alpha and beta radiation is possible comparatively simply, the effect of the gamma radiation on the shielding or on the housing of the semiconductor components nevertheless means that to a minor extent secondary alpha and beta particles are also created, which in turn interact with the semiconductor crystal. The interaction of such an irradiated particle with a lattice atom means that the latter can be released from the lattice, and a void is created. The free atom can, if it possesses sufficient transferred impact energy, eject further atoms, or migrate to an interstitial position. What is known as a vacancy-interstitial complex is formed.

A major effect of impacting radiation is the generation of crystal defects, which give rise to additional energy states inside the forbidden band and thus generate centers of recombination. These effects occur in accelerated form in the case of semiconductor microstructures with an increased level of complexity, e.g. in microcontrollers, microprocessors, ASICs or FPGAs. In contrast, resistors or capacitors are scarcely effected.

For this reason use is preferably made of robust discrete semiconductor components such as transistors or diodes, in order to take account of an accelerated degeneration of the electrical parameters in the circuit, especially since overwhelmingly radiation-hard, older integrated semiconductor components, e.g. ICs, logic gates, etc., which have a structure size of more than 1 μm, are scarcely available on the semiconductor market any longer as a result of far-advanced miniaturization.

By using discrete semiconductor components a minimum service life, e.g. of 3 years, depending on the relevant requirements, e.g. those in a nuclear power plant, can thus be achieved. A requirement of this type may e.g. be that a fire alarm must "withstand" a radiation dose or an energy dose of 0.25 Gy in 3-year period. Gy (Gray, =100 rad) here designates the SI unit of absorbed energy dose D. The time-related absorbed energy dose is here referred to as the dose rate or dose output.

A full description of the effect of radioactive radiation on electronic semiconductor components, in particular the damage cumulated over time or temporary damage associated therewith to such semiconductor components, is provided in the dissertation "Bauelemente-Degradation durch radioaktive Strahlung and deren Konsequenzen für den Entwurf strahlenresistenter elektronischer Schaltungen" [Component degradation as a result of radioactive radiation and its consequences for the design of radiation-resistant electronic circuits] by Detlef Brumbi, Faculty for Electronic Engineering at the Ruhr University Bochum, 1990.

Publication JPL D-33339 by the Jet Propulsion Laboratory (JPL) of the California Institute of Technology (CIT), Pasadena, Calif., USA, dated Jun. 6, 2009, entitled "Test Method for Enhanced Low Dose Rate Damage (ELDRS) Effects in Integrated Circuits for Outer Planetary Mission" examined, with a view to the planned Jupiter Europa Orbiter (JEO) mission, a range of integrated circuits such as voltage regulators, operational amplifiers and comparators using bipolar and BiCMOS technology for their sensitivity to radiation using a two-stage accelerated test procedure. To speed up the test, higher dose rates were used compared to the real dose rates expected during the mission. A real test with the cumulated radiation dose expected for the entire mission of up to 1000 krad(Si) would in contrast take too much time and hence would be impracticable. In the proposed ELDRS test the circuits are first irradiated with a low maximum dose rate of 10 mrad(Si)/s up to a radiation dose of 30 to 50 krad. The circuits are then irradiated with a dose rate of 40 mrad(Si) until the required overall radiation dose is reached.

Appendix 1 to the publication also discloses that during the irradiation test the temperature of the circuits can also be increased in addition to increasing the dose rate, in order to offset the increase in the rate of formation of induced hole sites caused thereby by an increase in a countervailing recombination rate due to thermal causes. It is also disclosed that if the circuit temperature selected is too high ("If the temperature is too high, the damage may actually anneal, as shown in the second figure for the Motorola LM324"), as in the example in FIGS. 10 and 11 at 135° C., the damage to the circuit actually to be determined undesirably disappears again as a result of the "annealing effect".

SUMMARY

Starting from the related art cited in the introduction, it is one possible object to specify an integrated circuit with an increased service life for (intended) operation in an area with ionizing radiation.

It is a further possible object to specify an improved hazard alarm for use in an (intended) area with ionizing radiation.

Finally it is a possible object to specify a particularly simple method which enables information about damage to an integrated circuit that is exposed to ionizing radiation impacting thereon to be determined.

According to the inventor's proposal, the integrated circuit has at least one part of a temperature control circuit for the regulated increase of the circuit temperature to a predefined, substantially constant operating temperature. To this end the electrical power consumption of the circuit is increased by an adjustable additional electrical power. The circuit furthermore has an output facility for information about damage to the integrated circuit caused by the ionizing radiation impacting thereon, it being possible to determine the information about damage from a radiation-dose-dependent decrease in the adjustable additional electrical power.

"From a radiation-dose-dependent decrease in the adjustable additional electrical power" means a decrease in the adjustable additional electrical power dependent on the absorbed radiation dose of the integrated circuit. The absorbed radiation dose is also abbreviated as TID ("Total Irradiated Dose" or "Total Ionizing Dose"). The physical unit for this is "rad" or "Gy" (Gray=100 rad). The term "energy dose" can also be used instead of the term "radiation dose".

The reason for the radiation-dose-dependent decrease in the requisite adjustable additional electrical power is the radiation-dose-dependent increase in the leakage current power loss in the integrated circuit.

The proposals are based on the finding that with increasing radiation- or energy-dose-dependent leakage current power loss, which in turn heats up the integrated circuit, the adjustable additional power or the additional heat output required to heat up the integrated circuit to the predefined operating temperature can be correspondingly reduced. This increase in the leakage current power loss or the decrease in the requisite additional power is then a measure for the radiation-dose-dependent damage to the integrated circuit.

The decrease in the adjustable additional electrical power is thus a long-term trend which arises in the case of otherwise unchanged, substantially identical external basic conditions such as identical ambient temperature and identical electrical power loss of the integrated circuit, less the adjustable additional electrical power for the additional heating of the integrated circuit. Thus this means the straightforward electrical power loss that the integrated circuit requires for its intended use, e.g. in the case of a smoke detector when monitoring fire parameters that have been detected and are to be processed.

By using the determined information about damage the end of the service life or the remaining residual operating time can advantageously be determined for the integrated circuit. The information about damage can be e.g. a degree of damage, e.g. a percentage value or a numerical value. In the case of a percentage value a value of 0% can characterize the new state and a value of 100% the failure state of an integrated circuit. The 0% value can correspond e.g. to a leakage current power loss value in the new state, and the 100% value to a leakage current power loss value in the event of the failure of the integrated circuit. Intermediate percentage values can be derived from the ratio of the present leakage current power loss value to the difference between the leakage current power loss value in the failed state to the leakage current power loss value in the new state. The leakage current power loss values can also be determined metrologically as part of a type or sample inspection for a respective integrated circuit, empirically or on the basis of a computer-aided simulation model.

The information about damage can also be a damage report, which is output as a signal, as text, as a data word or as binary information, e.g. damage-free/damaged.

Another advantage is that a radiation sensor for detecting ionizing radiation can be dispensed with.

The increase in the leakage current power loss can be determined e.g. by current measurement sensors integrated into the circuit. Preferably the determination is effected by evaluating the activation and deactivation times for switching on chip-internal functional modules which are not necessarily or not continuously required for the correct operation of the integrated circuit. The functional module can be e.g. an A/D converter or a D/A converter, which is not required but which generates a heat power loss after activation. If the ratio of activation time to deactivation time as a manipulated variable for the heating control of the integrated circuit decreases, e.g. with the operating time of the integrated circuit in an ionizing environment, this decrease thus correlates with an increase in the damage to the integrated circuit caused by radiation.

This information about damage can be output electrically, e.g. via at least one terminal pin of the integrated circuit, e.g.

as an analog voltage value, in digitally coded form via several terminal pins or as a serial sequence of data bits via a terminal pin. Alternatively it can also be output by optically, e.g. via an LED integrated into the circuit or wirelessly by a radio interface integrated into the circuit.

According to one embodiment the predefined, substantially constant operating temperature lies in a range between 70° C. and a maximum operating temperature specified by a manufacturer of the integrated circuit. The integrated circuit is here in particular designed for an extended temperature range or for a high temperature range. The maximum specified operating temperature is e.g. 90, 100, 110 or 120° C. Higher temperatures are also possible, e.g. 150° C.

According to another embodiment the circuit has a semiconductor chip and a chip housing. At least one electrical heating element for heating up the integrated circuit is applied on the semiconductor chip, which is also called a substrate. Alternatively or additionally at least one electrical heating element can be applied in the chip housing. The electrical heating element is preferably an actuable semiconductor component, e.g. a bipolar transistor the power loss of which can be adjusted, or an FET, or an ohmic resistor, e.g. an SMD resistor. Several such resistors can be distributed horizontally on the semiconductor chip or in the chip housing.

According to a preferred embodiment the integrated circuit has a semiconductor chip, on which a temperature sensor, in particular a pn diode, is integrated for detecting the circuit temperature. The temperature sensor is here part of the temperature control circuit. As a result the temperature inside the chip can be determined both accurately and quickly. No external wiring of the integrated circuit is required.

The integrated circuit is in particular a microcontroller, microprocessor, FPGA or ASIC manufactured using CMOS technology.

According to another embodiment the circuit is a processor-aided circuit. At least one part of the temperature control circuit is implemented as a computer program which is executed on the integrated processor-aided circuit. As a result temperature control is easy to implement.

Preferably the processor-aided circuit has an analog/digital converter for detecting an electrical measured variable output by the temperature sensor and correlated with the circuit temperature. A corresponding digital value is further processed by the processor-aided circuit for temperature control. The measured variable can be e.g. a measured voltage applied to the temperature sensor or a measured current flowing through the temperature sensor, either of which increases or alternatively decreases with increasing temperature.

Preferably the integrated processor-aided circuit is a microcontroller. The computer program executed on the microcontroller for temperature control has suitable program steps and/or it actuates a suitable power loss control program to actuate or temporarily switch on internal function groups of the microcontroller such that the requisite electrical power consumption for controlling the temperature of the microcontroller can be set to the operating temperature. The functional modules are e.g. timers, memories, clock generation, hardware multipliers, DMAs (Direct Memory Access), watchdog, serial interfaces, comparators, DACs (Digital to Analog Converter), ADCs (Analog to Digital Converter), as well as analog or digital outputs.

The analog or digital outputs can be connected e.g. to an external ohmic resistor, e.g. to an SMD resistor which is dimensioned in terms of an output adjustment such that inside the chip a maximum power loss is introduced in the form of heat. The adjustable additional power can e.g. also be increased by memory copying actions or by executions of mathematical functions in terms of a rise in the CPU or processor load. Alternatively or additionally the clock rate of the processor or microcontroller can be increased.

The actuating and/or switching on of the internal functional modules is preferably further effected by the temperature control program such that the heat losses arising on the semiconductor chip occur as evenly as possible over the surface.

To this end the thermal local effect of a respective switched-on functional module on the integrated circuit can be determined by a thermal imaging camera. The location as well as the power loss arising there can then be determined metrologically for each functional module. By suitably superimposing actuation of the functional modules an actuation and deactuation profile for the functional modules can thus be determined for a currently required output value for the adjustable additional electrical power. These profiles can then be mapped in the form of suitable program steps in the temperature control program.

According to one embodiment the temperature control program has suitable program steps for determining the requisite adjustable additional electrical power for regulating the temperature of the integrated circuit to the operating temperature. It furthermore has program steps for determining the information about damage to the integrated circuit from the increase in the leakage current power loss or from the corresponding decrease in the additional electrical power, and outputting it. Alternatively or additionally the temperature control program has program steps for outputting a warning message if the leakage current power loss exceeds a predefined maximum value or if the requisite additional power falls below a predefined minimum value.

According to a particularly advantageous embodiment the integrated circuit is additionally encapsulated in heat-insulating fashion. The heat insulation can be implemented e.g. as a module casing made of insulating material, in which the integrated circuit as well as if appropriate the further electrical components are housed.

If the integrated circuit is applied on a circuit substrate, the heat insulation can be implemented as a half-shell made of insulating material which encloses the integrated circuit from one assembled side. Possible insulating materials for the envisaged operating temperature range include temperature-resistant plastics e.g. polyurethane in the form of rigid foam plates. They can also be foamed elastomers based on neoprene rubber, on EPDM (ethylene-propylene-diene rubber) or similar rubber-like base materials. They can further be formed e.g. of foamed glass. The aforementioned materials must be stable up to the selected maximum operating temperature.

Alternatively or additionally the heat insulation can be a vacuum insulation in accordance with the thermos flask principle. In this case the integrated circuit can be housed in a module casing largely emptied of air, e.g. made of metal. The module casing can also be double-walled, in which case the area between the double wall is then largely emptied of air or filled with a heat-insulating gas, e.g. noble gas. The electrical supply leads are then correspondingly led out of this module casing in a gas-tight fashion.

The inventor also proposes a hazard alarm, in particular with a fire alarm, which has at least one detector unit for detecting at least one hazard parameter, and furthermore electrical components as well as at least one temperature-controlled integrated circuit. The integrated circuit is designed at least to further process the respective detected hazard parameter, to output an alarm signal and to output information about damage to the at least one integrated circuit caused by the ionizing radiation impacting thereon.

The hazard alarm can also be designed as a linear smoke detector. This type of detector has a smoke detector unit and if appropriate at least one light deflection unit. The smoke detector unit comprises the detector unit, which in turn has a light emitter for emitting a light beam traversing a measured distance and a light receiver for receiving the emitted light beam at the end of the measured distance, in order to detect the at least one hazard parameter. The at least one deflection unit is provided for deflecting the light beam emitted by the light emitter back to the light receiver. The linear smoke detector has electrical components as well as at least one temperature-controlled integrated circuit. The latter is present at least for further processing the respective detected hazard parameter, for outputting an alarm signal and for outputting information about damage to the at least one integrated circuit caused by the ionizing radiation impacting thereon.

According to one embodiment the warning message can be output via the at least one integrated circuit to a hazard alarm panel connected to the hazard alarm using signal technology or data processing technology, if the respective leakage current power loss exceeds a predefined maximum value or if the respective additional electrical power falls below a predefined minimum value.

Finally the inventor proposes a method corresponding to the integrated circuit, which method is provided for determining information about damage to an integrated circuit caused by ionizing radiation impacting thereon. In this case the circuit temperature is increased in regulated fashion to a predefined, substantially constant operating temperature, in order to at least partially offset an increased electrical hole-type conductivity induced in a semiconductor chip of the integrated circuit by the ionizing radiation by a hole recombination rate which increases as the circuit temperature increases. To increase the circuit temperature the electrical power consumption of the integrated circuit is increased by an adjustable additional electrical power. The information about damage to the integrated circuit is determined from the increase in a radiation-dose-dependent leakage current power loss in the circuit or from a corresponding decrease in the requisite additional electrical power, and is then output.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
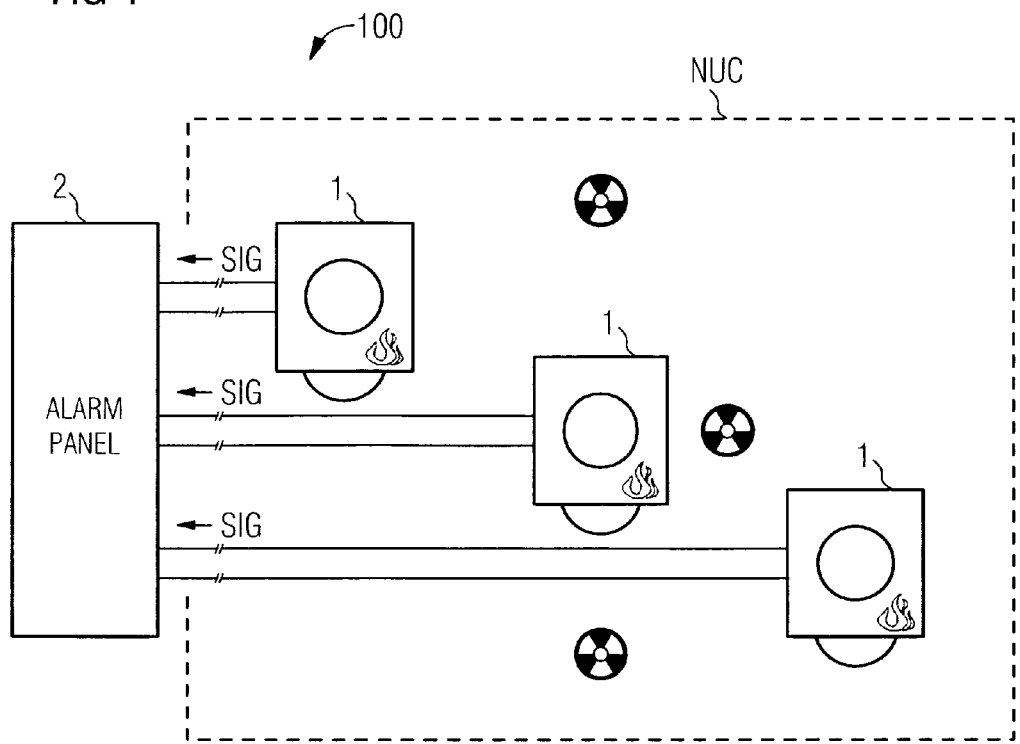
FIG. 1 shows an example of a hazard detection system with an alarm panel and with three hazard alarms in a nuclear area, each connected to the alarm panel via a two-wire line.

Reference will now be made in detail to the preferred embodiments of the present invention, examples of which are illustrated in the accompanying drawings, wherein like reference numerals refer to like elements throughout.

FIG. 1 shows an example of a hazard detection system 100 with an alarm panel 2 and with three hazard alarms 1 in a nuclear area NUC, each connected to the alarm panel 2 via a two-wire line known per se.

The nuclear area NUC is characterized by three symbols for radioactive radiation, in other words for ionizing radiation. The hazard alarms 1 shown can be e.g. optical smoke detectors which have an optical detector unit based on the scatter principle for detecting smoke particles. In very general terms the detector unit is provided for detecting at least one hazard parameter or fire parameter. The hazard alarm can alternatively, as a heat detector, have a temperature detector unit, e.g. a temperature sensor, for fire detection. Furthermore, as a smoke gas detector it can have a gas sensor for detecting smoke gases typical of a fire. As the hazard alarms 1 are distributed at points in an area to be monitored, they can also be referred to as point-type detectors.

Furthermore, the alarm panel 2 is disposed outside the nuclear area NUC. If at least predominantly only fire alarms 1 and in particular only smoke detectors 1 are connected it can also be referred to as a fire alarm panel. As the alarm panel 2 is not in principle provided for operation in a nuclear area NUC, it typically only has industry-standard semiconductor components. SIG designates an alarm or detector signal SIG output by the connected hazard alarm 1, which signal indicates the status of the hazard alarm. The alarm signal SIG can be e.g. a first or second alarm level, an operational readiness message, an error message or a coded detector level. Normally the possible states of such an alarm signal SIG are transmitted in known fashion, current-modulated, from the connected hazard alarm 1 to the alarm panel 2. The respective alarm signal SIG is ultimately detected by the alarm panel 2, which then if appropriate outputs an alarm message, e.g. to a fire department.

Figure 2:
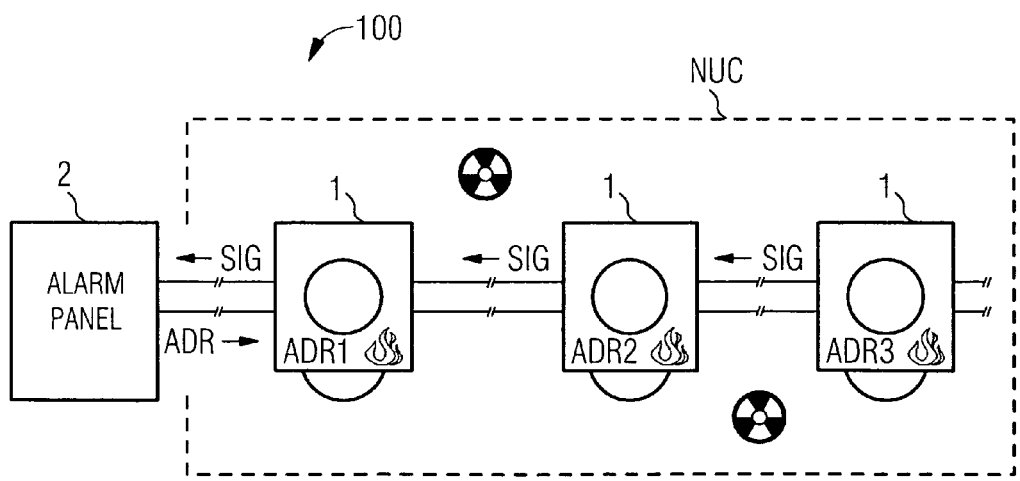
FIG. 2 shows an example of another hazard detection system with an alarm panel and with three addressable hazard alarms in a nuclear area connected to the alarm panel via a common two-wire line.

FIG. 2 shows an example of a further hazard detection system 100 with an alarm panel 2 and with three addressable hazard alarms 1 in a nuclear area NUC connected to the alarm panel 2 via a common two-wire line.

ADR1-ADR3 designates a respective selection address which is preferably set manually in the hazard alarms 1 shown. ADR designates a detector address output by the alarm panel 2. If this matches one of the selection addresses ADR1-ADR3, the respective hazard alarm 1 is addressed.

SIG in turn designates the alarm signal output by the addressed hazard alarm 1 in response to the valid addressing which has taken place.

Preferably the power supply to the hazard alarm 1 is effected both in FIG. 1 and in FIG. 2 by the alarm panel 2 via the two-wire lines (not further designated). The two-wire line can also be referred to as a detector bus.

Figure 3:
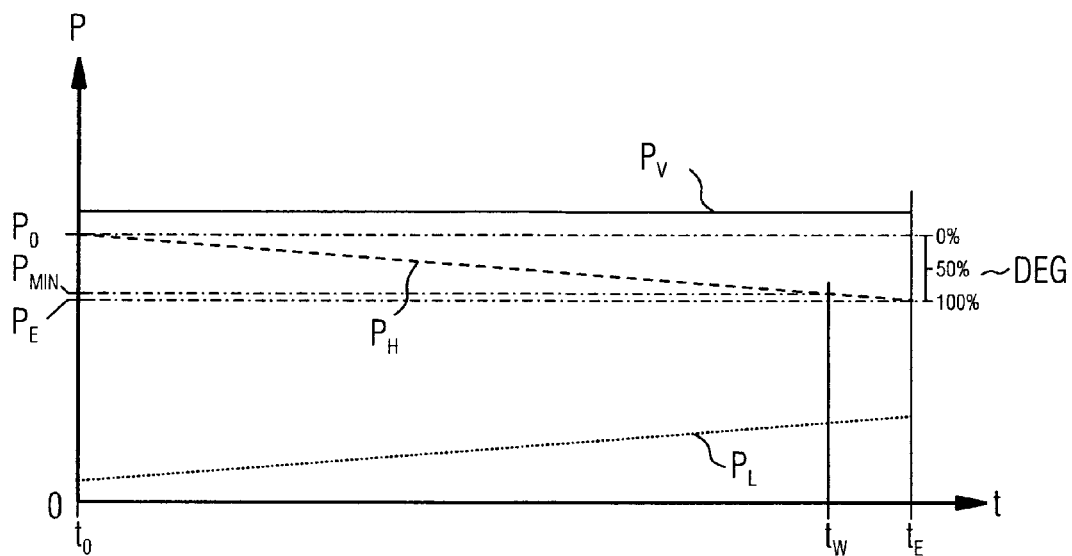
FIG. 3 shows a diagram of an example of an increase in the radiation-dose-dependent leakage current power loss in an integrated circuit as well as a degree of damage, derived therefrom, according to the inventor's proposals.

FIG. 3 shows a diagram of an example of an increase in the radiation-dose- or energy-dose-dependent leakage current power loss $P_L$ in an integrated circuit as well as information DEG derived therefrom about damage to the integrated circuit in the form of a degree of damage. $P_V$ designates the overall electrical power consumption of the integrated circuit, which by way of example is assumed to be constant. Viewed as an average this is e.g. also the case with smoke detectors. $t_0$ designates the timepoint as of which the circuit is exposed to constant ionizing radiation, e.g. radioactive radiation in a nuclear area, with for example a constant dose output. The timepoint $t_0$ can thus also be referred to as the starting time for the start of the beam arrangement. $t_E$ designates the timepoint of the expected end of service life, in other words the timepoint of the technical failure of the integrated circuit, $P_0$ and $P_E$ the corresponding associated additional electrical power value, and $P_{MIN}$ a minimum power value for the output of a warning message at the timepoint $t_W$ to the effect that a technical failure of the integrated circuit is likely soon. In the present example the minimum power value $P_{MIN}$ corresponds to a degree of damage of approx. 90%.

As FIG. 3 shows, the leakage current power loss $P_L$ increases over time as a result of the damaging effect of the ionizing radiation. In contrast, the adjustable additional electrical power $P_H$ needed to maintain the predefined operating temperature of the integrated circuit decreases. In the present example a percentage value increasing over time is determined for the degree of damage DEG, the 0% value designating the new state or the state of the electrical circuit before exposure to ionizing radiation. The 100% value designates the end of the service life of the integrated circuit.

The linearly increasing leakage current power loss $P_L$ in FIG. 3 must be understood as merely an example. The actual progression can be determined e.g. metrologically, empirically or by a computer-aided simulation model.

Figure 4:
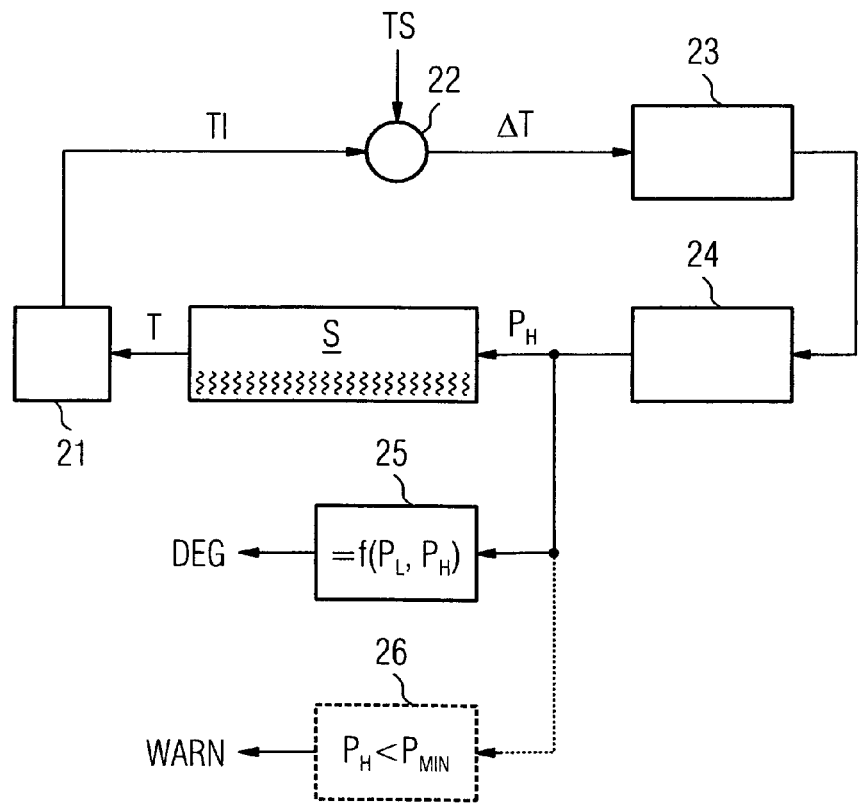
FIG. 4 shows an example of a proposed temperature control circuit for controlling the temperature of an integrated circuit with output of computationally determined information about damage to the integrated circuit as well as a warning message, FIG. 5 functionally shows an example of a proposed temperature control circuit integrated into a microcontroller as an integrated circuit as well as with a temperature control program for controlling the electrical power consumption as well as for determining and outputting information about damage to the microcontroller.

FIG. 4 shows an example of a temperature control circuit for controlling the temperature T of an integrated circuit with output of computationally determined information DEG about the damage to the integrated circuit as well as a warning message WARN.

The temperature control circuit here has a temperature sensor 21 for detecting an actual temperature TI, a comparator 22 or difference generator for comparing the detected actual temperature TI with a predefined setpoint temperature TS, a controller 23 to which the determined difference value Δ is fed as an error deviation, and finally a downstream actuating element 24 for adjusting the additional electrical power $P_H$, so that the integrated circuit has an electrical power consumption $P_L$ which is sufficient to maintain the predefined operating temperature TS in particular of the semiconductor chip S inside the integrated circuit. The semiconductor chip S is connected via so-called bonding wires to terminal contacts of the integrated circuit which are led out of the chip housing. The thermal power emitted to the outside by the semiconductor chip S via the chip housing in this case substantially corresponds to the electrical power consumption $P_L$, i.e. the (total) electrical power loss, which ultimately is converted into heat inside the chip.

The reference character 25 designates a first function block, in which a current value for the degree of damage is determined as information about damage DEG from the determined leakage current power loss $P_L$ or from the determined requisite additional power $P_H$, and is output therefrom. The reference character 26 designates a second function block, in which the currently determined additional power $P_H$ is compared to a minimum power value $P_{MIN}$. A warning message WARN is then output in order to report an imminent failure of the integrated circuit.

Figure 5:
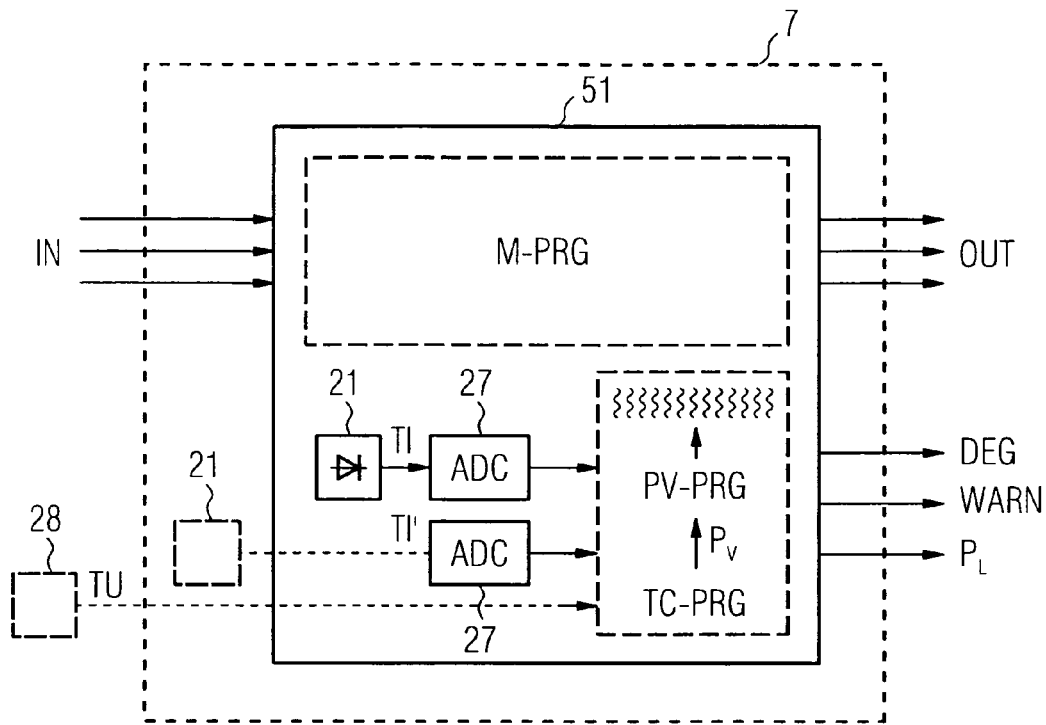

FIG. 5 functionally shows an example of a temperature control circuit integrated into a microcontroller as a processor-aided integrated circuit 51 as well as with a temperature control program TC-PRG for controlling the electrical power consumption $P_V$ and for determining and outputting information about damage DEG to the microcontroller 51.

In general the integrated circuit 51 shown is provided for operation in an area with ionizing radiation which has at least one part of a temperature control circuit for the regulated increase of the circuit temperature T to a predefined, substantially constant operating temperature. To this end the electrical power consumption $P_V$ of the circuit 51 is increased by an adjustable additional electrical power. In addition, it has an output facility for information about damage DEG to the integrated circuit 51 caused by the ionizing radiation impacting thereon, it being possible for the information about damage DEG itself to be determined from the increase in a radiation-dose-dependent leakage current power loss $P_L$ in the circuit 51 or from a corresponding decrease in the additional power $P_H$.

In the present example IN, OUT designate signal inputs and signal outputs known per se. At least one part of the temperature control circuit is implemented as a computer program TC-PRG that can be executed on the microcontroller 51. The computer program TC-PRG executed on the microcontroller for temperature control has suitable program steps and/or it actuates a suitable power loss control program PV-PRG, in order to actuate or temporarily switch on internal function groups (not further shown) of the microcontroller such as timers, memories, clock generation, hardware multipliers, DMA, watchdog, serial interfaces, comparators, DACs as well as analog or digital outputs, such that the requisite electrical power consumption $P_V$ for controlling the temperature of the microcontroller 51 can be set to the operating temperature TS.

In the example in FIG. 5 M-PRG designates a main program which is designed to execute the actual function of the microcontroller 51, e.g. to control and regulate a device or a system, or—e.g. in the case of a fire alarm—to actuate, detect measured values and evaluate a detector unit connected thereto as well as to output a corresponding alarm message via a connected detector bus.

Furthermore, the processor-aided circuit has an analog/digital converter 27 for detecting an electrical measured variable output by the temperature sensor 21 and correlating with the circuit temperature T. A corresponding digital value is further processed by the processor-aided circuit 51 for temperature control. TI designates an actual temperature TI as a correlating electrical measured variable.

The actual temperature TI is in this case output as an electrical variable, e.g. as a measured voltage, by a temperature sensor 21 integrated on the microcontroller 41 in the form of a pn diode. As indicated by the dotted line in FIG. 5, parts of the temperature control circuit can also be disposed outside the microcontroller 51, such as an external temperature sensor 21 here. The external temperature sensor 21 is for example disposed outside the microcontroller 51, but inside heat insulation 7 which surrounds the microcontroller 51. The reference character TI' designates a corresponding further actual temperature. Furthermore, an ambient temperature sensor 25 can be provided for detecting an ambient temperature outside the heat insulation 7, which is additionally detected by the microcontroller 51 and is also taken into account in the temperature control.

Figure 6:
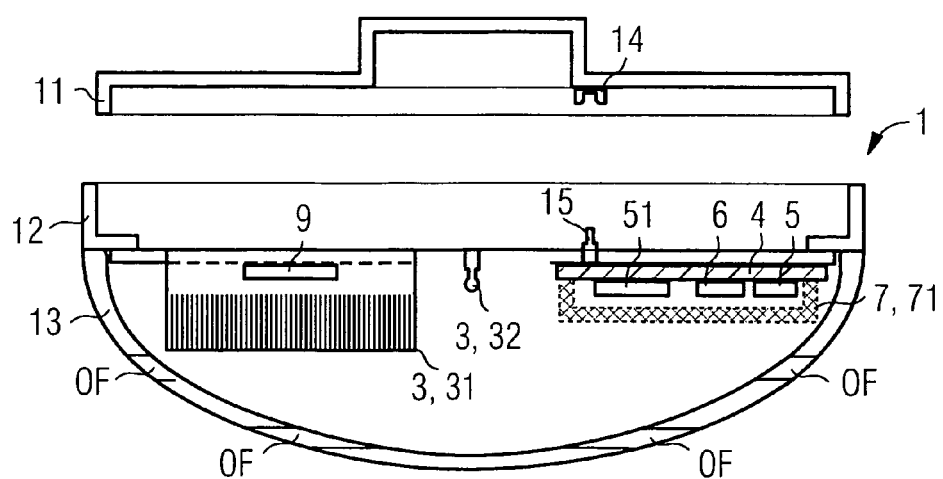
FIG. 6 shows a combined smoke gas/heat detector as an example of a hazard alarm with the proposed microcontroller.

FIG. 6 shows a combined smoke gas/heat detector as an example of a hazard alarm 1 with a microcontroller 51.

Visible in the top part of the figure shown is a detector base 11, to which the actual hazard alarm 1 can be detachably attached. The detector base 11 is typically provided for simplified mounting of the hazard alarm 1. This is normally mounted spaced apart from other detector bases 11 on the ceiling of an area to be monitored. At the same time the detector base 11 is used for connection to a detector bus installed in linear or star-shaped fashion or for connection to a corresponding two-wire line, as shown in FIG. 1 and FIG. 2. The linear detector bus is in this case looped through from one detector base 11 to the next detector base 11, the respective lines of the two-wire line being electrically contacted and routed to an associated detector contact 14, e.g. in the form of a jack. The detector contact 14 is provided for contacting a corresponding mating contact 15, e.g. in the form of a male contact, in the attached state of the hazard alarm 1 on the detector base 11. The detector base 11 can of course also be an integral part of the hazard alarm 1 itself.

Visible in the lower part of FIG. 6 is a sectional view through the hazard alarm 1. The reference character 12 designates a base body and 13 a cover of the detector housing 12, 13. Openings OF are furthermore present in the cover 13, through which smoke, smoke gases and/or heated air to be detected can reach a corresponding, internal detector unit 3.

The present example involves a combined smoke gas/heat detector 1 with a smoke gas detector unit 31 and a temperature detector unit 32 in the form of a temperature-dependent resistor. The reference character 9 designates a gas sensor sensitive to specific combustion gases, e.g. a gas FET. The corresponding detector signals are then normally evaluated by an electronic evaluation unit, e.g. by a microcontroller. Based on this, the latter generates an associated detector status, which ultimately is output on the detector bus, e.g. an alarm message.

The hazard alarm 1 has electrical components 6 as well as at least one temperature-controlled integrated circuit 51 at least for further processing of the respective detected hazard parameter, for outputting an alarm signal and for outputting information about damage to the at least one integrated circuit 51 caused by the ionizing radiation impacting thereon. The integrated circuit 51 is in the present example a microcontroller manufactured using CMOS technology. Alternatively it can be a microprocessor, FPGA or ASIC.

The predefined, substantially constant operating temperature lies in a range between 70° C. and a maximum operating temperature specified by a manufacturer of the microcontroller 51. The microcontroller 52 is in particular designed for an extended temperature range or for a high temperature range, e.g. for military applications.

The microcontroller 51 as well as further electrical components 5, 6 are in this case disposed on a circuit substrate 4, e.g. on a printed circuit board. Furthermore, the components 5, 6 shown are thermally decoupled from both the detector units 3. The reference character 5 designates further, typically non-radiation-hard semiconductor components, while the reference character 6 designates typically radiation-hard electrical components. The latter are e.g. passive components such as resistors, coils or capacitors or electronic components such as semiconductor diodes or transistors with semiconductor structures in the μm range.

In the present example the thermal insulation is achieved by the spatial separation from one another. In addition a dividing wall (not further shown) designed or disposed in the basic housing 12 or in the cover 13 can also be present, and can thermally insulate the two detector units 3 from the printed circuit board 4 containing the components 5, 6.

In the present example the components 5, 6 are thermally insulated from the surroundings by a hood-shaped heat insulation half-shell 71. As a result, the space needed for heating up the non-radiation-hard semiconductor components 5, 51 is reduced to the closed off interior of the heat insulation half-shell 71.

Furthermore, the thermally insulating encapsulation or thermal insulation prevents smoke to be detected from being thermally deflected and no longer penetrating the inlet openings OF to reach the two detector units 31, 32.

Another advantage is that as a result of the heat insulation 7 the power requirement needed via the detector bus for heating is minimized. The predefined operating temperature of the components 5, 6, 51 included in the heat insulation 7 is achieved and maintained by the microcontroller 51, in that the heat output required for this is provided by the adjustable additional electrical power. In this case the heat insulation 7 also means that as a result of thermal compensating effects inside the heat insulation 7 all components 5, 6, 51 have an substantially identical operating temperature. In this sense the microcontroller 51 also takes over the heating up and maintenance of the operating temperature for the other components 5, 6.

Figure 7:
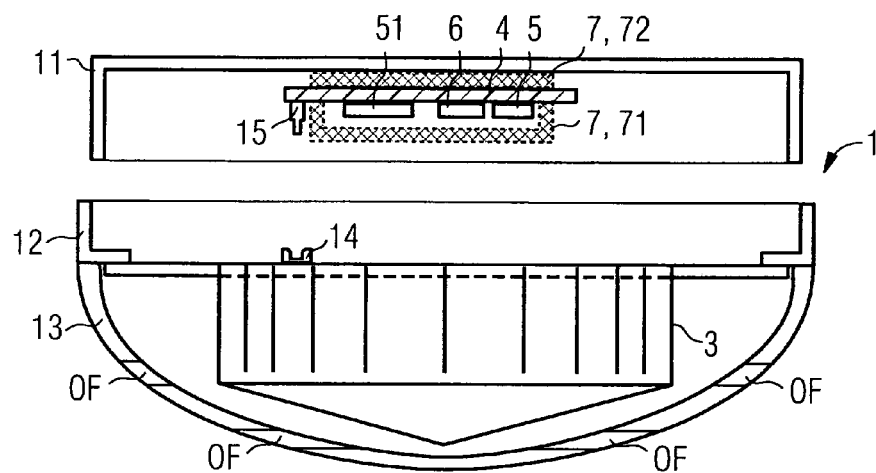
FIG. 7 shows an optical smoke detector as an example of a hazard alarm with a heat-insulating, encapsulated microcontroller.

FIG. 7 shows an optical smoke detector 1 as an example of a hazard alarm with a thermally insulating encapsulated microcontroller 51. Compared to the previous case, the heat insulation 7 is composed of a heat insulation half-shell 71 and an opposing heat insulation plate 72 merely separated by the circuit substrate 4. As a result the degree of heat insulation vis-à-vis the surroundings is increased compared to the previous embodiment. The reference character 3 here designates an optical detector unit which has an optical measuring chamber (not further shown) in accordance with the scattered light principle.

Figure 8:
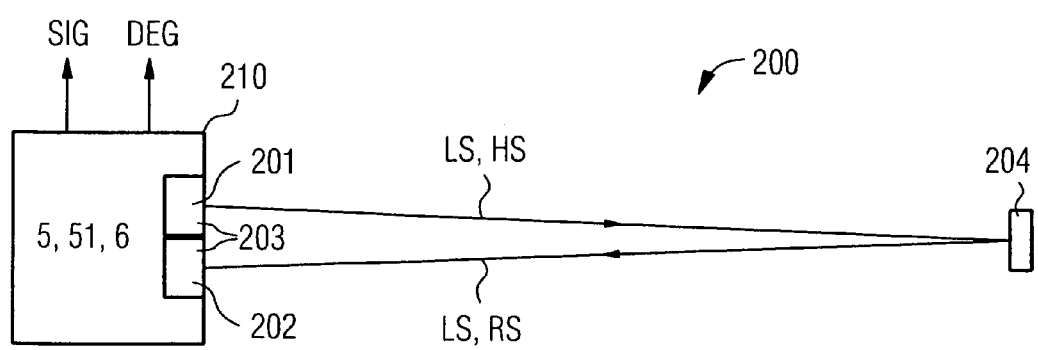
FIG. 8 shows an example of a hazard alarm designed as a linear smoke detector with a deflection unit and a smoke detector unit with the proposed microcontroller.

FIG. 8 shows an example of a hazard alarm designed as a linear smoke detector 200, with a deflection unit 204 and a smoke detector unit 210 with the proposed microcontroller 51.

In the present example the smoke detector unit 210 typically designed as a subassembly and the deflection unit 204 lie opposite one another. The smoke detector unit 210 has the detector unit 203 for detecting the at least one hazard parameter. The latter is typically a minimum smoke density or a minimum smoke particle density. The detector unit 203 for its part comprises a light emitter 201 for emitting a light beam LS traversing a measured distance and an adjacently disposed light receiver 202 for receiving the emitted light beam LS at the end of the measured distance. The light emitter 201 preferably emits strongly concentrated infrared light, e.g. by an IR laser or an IR LED. The light receiver 202 is sensitive to the light to be received. It is e.g. an IR photodiode or an IR phototransistor. The deflection unit 204 is in the present case a deflecting prism. Alternatively it may be a mirror or a so-called retroreflector in the sense of a cat's eye. The deflection unit 204 is here provided for deflecting the light beam LS emitted by the light emitter 201 back to the light receiver 202.

In the present example the light beam LS is composed of an outbound beam HS and a return beam RS, which run approximately antiparallel to one another. The measured distance covered in this case by the light beam LS is composed here of the length of the outbound beam HS and the length of the return beam RS, in other words twice the distance between the smoke detector unit 210 and the deflection unit 204. The linear smoke detector has electrical components 6 as well as at least one temperature-controlled integrated circuit 51 at least for further processing the respective detected hazard parameter, for outputting an alarm signal SIG and for outputting information about damage DEG to the at least one integrated circuit 51 caused by the ionizing radiation impacting thereon.

As a result the linear smoke detector 200 can be used for longer in the area with an increased radioactive beam arrangement in comparison to the related art, e.g. in the so-called keep-out area NUC of a nuclear reactor in a nuclear power plant.

Alternatively—not shown in the figure—the light emitter and the light receiver can also be disposed spatially apart from one another. In this case too no deflection unit is required. Instead of the deflection unit shown, the light emitter is disposed and oriented toward an opposing light receiver. In this case the distance between the light emitter and the light receiver corresponds at the same time to the measured distance.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV,* 69 USPQ2d 1865 (Fed. Cir. 2004).

The invention claimed is:

1. An integrated circuit device for operation in an area with ionizing radiation, comprising:
   an integrated circuit;
   at least one part of a temperature control circuit to increase a temperature of the integrated circuit to an operating temperature above a normal-operation ambient temperature, and to regulate the temperature to maintain the operating temperature, the temperature control circuit operating by supplying an adjustable additional electrical power to the integrated circuit; and
   an output facility to receive information regarding the additional electrical power supplied to the integrated circuit, to correlate a radiation dose with a decrease in the additional electrical power, and to determine information about damage to the integrated circuit caused by ionizing radiation impacting on the integrated circuit, the information about damage being determined from a radiation-dose-dependent decrease in the additional electrical power.

2. The integrated circuit device as claimed in claim 1, wherein the operating temperature is a temperature between 70° C. and a maximum operating temperature specified by a manufacturer of the integrated circuit.

3. The integrated circuit device as claimed in claim 1, wherein
   the integrated circuit is formed from a semiconductor chip,
   the integrated circuit is provided in a chip housing, and
   a heating element to heat the integrated circuit is provided on the semiconductor chip and/or in the chip housing.

4. The integrated circuit device as claimed in claim 1, wherein
   the integrated circuit is formed from a semiconductor chip,
   a temperature sensor to detect the temperature of the integrated circuit is integrated on the semiconductor chip, and
   the temperature sensor is part of the temperature control circuit.

5. The integrated circuit device as claimed in claim 1, wherein
   the integrated circuit is formed from a semiconductor chip,
   a pn diode temperature sensor to detect the temperature of the integrated circuit is integrated on the semiconductor chip, and
   the temperature sensor is part of the temperature control circuit.

6. The integrated circuit device as claimed in claim 1, the integrated circuit is part of a microcontroller, microprocessor, a field-programmable gate array (FPGA) or an application specific integrated circuit (ASIC) manufactured using complementary metal-oxide-semiconductor (CMOS) technology.

7. The integrated circuit device as claimed in claim 1, wherein
   the integrated circuit is a processor-aided circuit, and
   at least one part of the temperature control circuit is implemented as a computer program executed on the processor-aided circuit.

8. The integrated circuit device as claimed in claim 7, wherein
   a temperature sensor detects the temperature of the processor-aided circuit and outputs an electrical measured variable, and
   the processor-aided circuit has an analog/digital converter to detect the electrical measured variable output by the temperature sensor, to correlate the electrical measured variable with temperature, and to output a digital value corresponding to the temperature.

9. The integrated circuit device as claimed in claim 7, wherein
   the processor-aided circuit is a microcontroller,
   the computer program regulates the temperature of the microcontroller by selectively switching on at least one internal functional module of the microcontroller selected from the group consisting of a timer, a memory, a clock, a hardware multiplier, digital memory access (DMA), watchdog, a serial interface, a comparator, a digital to analog converter (DAC), an analog output and a digital output, and
   the additional electrical power is used to selectively switch on the least one internal function of the microcontroller.

10. The integrated circuit device as claimed in claim 9, wherein the computer program selects the at least one internal functional module to achieve an even heat loss across a surface of the microcontroller.

11. The integrated circuit device as claimed in claim 7, wherein when executed on the processor-aided circuit, the computer program performs functions comprising:
    determining the additional electrical power required to regulate the temperature of the integrated circuit;
    determining the information about damage to the integrated circuit from the radiation-dose-dependent decrease in the additional electrical power; and
    outputting a warning message if the additional electrical power falls below a predefined minimum value.

12. The integrated circuit device as claimed in claim 1, wherein the integrated circuit is enclosed in heat-insulating encapsulation.

13. A fire alarm for operation in an area with ionizing radiation, comprising:
    a detector unit to detect a hazard parameter associated with fire; and
    an integrated circuit device comprising:

alarm circuitry to selectively output an alarm signal based on the hazard parameter;

at least one part of a temperature control circuit to increase a temperature of the integrated circuit to an operating temperature above a normal-operation ambient temperature, and to regulate the temperature to maintain the operating temperature, the temperature control circuit operating by supplying an adjustable additional electrical power to the integrated circuit; and an output facility to receive information regarding the additional electrical power supplied to the integrated circuit, to correlate a radiation dose with a decrease in the additional electrical power, and to determine information about damage to the integrated circuit caused by ionizing radiation impacting on the integrated circuit, the information about damage being determined from a radiation-dose-dependent decrease in the additional electrical power.

14. The hazard alarm as claimed in claim 13, wherein the detector unit is a linear smoke detector comprising:

a light emitter to emit a light beam; and a light receiver to receive the light beam after the light beam traverses a measured distance, in order to detect the hazard parameter.

15. The hazard alarm as claimed in claim 13, wherein the detector unit is a linear smoke detector comprising:

a light emitter to emit a light beam;

a light receiver to receive the light beam after the light beam traverses a measured distance, in order to detect the hazard parameter; and a deflection unit to deflect the light beam emitted by the light emitter back to the light receiver.

16. The hazard alarm as claimed in claim 13, wherein a warning message is output to a hazard alarm panel connected to the hazard alarm using signal or data processing technology, if the additional electrical power falls below a predefined minimum value.

17. A method for determining information about damage to an integrated circuit caused by ionizing radiation impacting thereon, comprising:

increasing a circuit temperature of the integrated circuit to an operating temperature above a normal-operation ambient temperature, maintaining the operating temperature, in order to at least partially offset an increased electrical hole-type conductivity induced in a semiconductor chip of the integrated circuit by the ionizing radiation by a hole recombination rate which increases as the circuit temperature increases;

using an adjustable additional electrical power to increase the circuit temperature and to maintain the operating temperature;

determining information about damage to the integrated circuit based on a decrease in the additional electrical power; and outputting the information about damage.

* * * * *